(12) United States Patent
Forbes

(10) Patent No.: US 7,101,770 B2
(45) Date of Patent: Sep. 5, 2006

(54) CAPACITIVE TECHNIQUES TO REDUCE NOISE IN HIGH SPEED INTERCONNECTIONS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 10/060,801

(22) Filed: Jan. 30, 2002

(65) Prior Publication Data

US 2003/0142569 A1 Jul. 31, 2003

(51) Int. Cl.
*H01L 21/76* (2006.01)

(52) U.S. Cl. ............... 438/422; 438/430; 438/454; 438/694

(58) Field of Classification Search ......... 438/422–430, 438/619, 454, 3
See application file for complete search history.

(56) References Cited

U.S. PATENT DOCUMENTS

| | | | | |
|---|---|---|---|---|
| 3,816,673 A | | 6/1974 | Miya ................. 179/170 R |
| 4,308,421 A | | 12/1981 | Bogese, II ............... 174/32 |
| 4,372,032 A | * | 2/1983 | Collins et al. ............ 438/285 |
| 4,394,712 A | | 7/1983 | Anthony ................. 361/411 |
| 4,631,636 A | | 12/1986 | Andrews ................. 361/385 |
| 4,749,888 A | | 6/1988 | Sakai et al. ................. 326/4 |
| 4,870,470 A | | 9/1989 | Bass, Jr. et al. ........... 357/23.5 |
| 4,933,743 A | | 6/1990 | Thomas et al. ............ 357/71 |
| 4,962,476 A | * | 10/1990 | Kawada ................. 365/53 |
| 4,977,439 A | | 12/1990 | Esquivel et al. ............ 357/49 |
| 5,135,889 A | | 8/1992 | Allen ..................... 437/195 |
| 5,157,361 A | | 10/1992 | Gruchalla et al. ............ 333/20 |
| 5,165,046 A | | 11/1992 | Hesson ................... 307/270 |

(Continued)

FOREIGN PATENT DOCUMENTS

WO    WO-94/05039    3/1994

OTHER PUBLICATIONS

Arnoldussen, Thomas C., "A Modular Transmission Line/Reluctance Head Model", *IEEE Transactions on Magnetics*, vol. 24,(Nov. 1988),pp. 2482–2484.

Hsu, Yimin , et al., "High frequency field permeability of patterned Ni80Fe20 and Ni45Fe55 thin films", *Journal of Applied Physics*, (Jun. 2001),pp. 6808–6810.

Johnson, H. , *High Speed Digital Designs: A Handbook of Black Magic*, Prentice–Hall. Inc., New Jersey, ISBN 0–13–395724–1,(1993),pp. 66–71, 194–197.

(Continued)

*Primary Examiner*—Michael Lebentritt
(74) *Attorney, Agent, or Firm*—Schwegman, Lundberg, Woessner & Kluth, P.A.

(57) ABSTRACT

Improved methods and structures are provided using capacitive techniques to reduce noise in high speed interconnections, such as in CMOS integrated circuits. The present invention offers an improved signal to noise ration. The present invention provides for the fabrication of improved transmission lines for silicon-based integrated circuits using conventional CMOS fabrication techniques. Embodiments of a method for forming transmission lines in an integrated circuit include forming a first layer of electrically conductive material on a substrate. The method includes forming a first layer of insulating material on the first layer of the electrically conductive material. The first layer has a thickness of less than 1.0 micrometers (μm). A transmission line is formed on the first layer of insulating material. The transmission line has a thickness and a width of approximately 1.0 micrometers. A second layer of insulating material is formed on the transmission line. And, a second layer of electrically conductive material is formed on the second layer of insulating material.

29 Claims, 10 Drawing Sheets

U.S. PATENT DOCUMENTS

| | | | |
|---|---|---|---|
| 5,168,334 A | 12/1992 | Mitchell et al. | 257/324 |
| 5,223,808 A | 6/1993 | Lee et al. | 333/24.1 |
| 5,258,648 A | 11/1993 | Lin | 257/778 |
| 5,313,361 A | 5/1994 | Martin | 361/699 |
| 5,343,366 A | 8/1994 | Cipolla et al. | 361/785 |
| 5,352,998 A | 10/1994 | Tanino | 333/247 |
| 5,357,138 A | 10/1994 | Kobayashi | 257/664 |
| 5,363,550 A | 11/1994 | Aitken et al. | 29/828 |
| 5,391,917 A | 2/1995 | Gilmour et al. | 257/690 |
| 5,438,224 A | 8/1995 | Papageorge et al. | 257/777 |
| 5,468,681 A | 11/1995 | Pasch | 437/183 |
| 5,510,758 A | 4/1996 | Fujita et al. | 333/247 |
| 5,521,536 A | 5/1996 | Yamashita et al. | 326/82 |
| 5,532,506 A | 7/1996 | Tserng | 257/276 |
| 5,567,654 A | 10/1996 | Beilstein, Jr. et al. | 437/209 |
| 5,587,119 A | 12/1996 | White | 264/104 |
| 5,598,031 A | 1/1997 | Groover et al. | 257/668 |
| 5,618,752 A | 4/1997 | Gaul | 438/626 |
| 5,646,067 A | 7/1997 | Gaul | 437/180 |
| 5,656,548 A | 8/1997 | Zavracky et al. | 438/23 |
| 5,663,596 A | 9/1997 | Little | 257/727 |
| 5,682,062 A | 10/1997 | Gaul | 257/686 |
| 5,699,291 A | 12/1997 | Tsunemine | 365/149 |
| 5,729,047 A | 3/1998 | Ma | 257/664 |
| 5,753,529 A | 5/1998 | Chang et al. | 437/67 |
| 5,767,001 A | 6/1998 | Bertagnolli et al. | 438/455 |
| 5,786,628 A | 7/1998 | Beilstein, Jr. et al. | 257/684 |
| 5,807,783 A | 9/1998 | Gaul et al. | 438/406 |
| 5,811,984 A | 9/1998 | Long et al. | 326/30 |
| 5,821,624 A | 10/1998 | Pasch | 257/776 |
| 5,834,799 A | 11/1998 | Rostoker et al. | 257/98 |
| 5,861,666 A | 1/1999 | Bellaar | 257/686 |
| 5,901,050 A | 5/1999 | Imai | 361/820 |
| 5,910,684 A | 6/1999 | Sandhu et al. | 257/758 |
| 5,915,167 A | 6/1999 | Leedy | 438/108 |
| 5,990,564 A | 11/1999 | Degani et al. | 257/778 |
| 6,022,787 A * | 2/2000 | Ma | 438/422 |
| 6,075,383 A | 6/2000 | Terletzki | 326/86 |
| 6,133,621 A * | 10/2000 | Gaibotti et al. | 257/659 |
| 6,137,164 A | 10/2000 | Yew et al. | 257/686 |
| 6,143,616 A | 11/2000 | Geusic et al. | 438/389 |
| 6,181,004 B1 | 1/2001 | Koontz et al. | 257/691 |
| 6,219,237 B1 | 4/2001 | Geusic et al. | 361/699 |
| 6,223,273 B1 | 4/2001 | Kanekawa et al. | 712/33 |
| 6,242,796 B1 | 6/2001 | Sim et al. | 257/664 |
| 6,255,852 B1 | 7/2001 | Forbes et al. | 326/86 |
| 6,281,042 B1 | 8/2001 | Ahn et al. | 438/108 |
| 6,373,740 B1 | 4/2002 | Forbes et al. | 365/51 |
| 6,388,198 B1 | 5/2002 | Bertin et al. | 174/251 |
| 6,420,778 B1 | 7/2002 | Sinyansky | 257/664 |
| 6,433,408 B1 | 8/2002 | Anjo et al. | 257/664 |
| 6,545,338 B1 * | 4/2003 | Bothra et al. | 257/508 |
| 6,555,858 B1 | 4/2003 | Jones et al. | 257/295 |
| 6,569,757 B1 * | 5/2003 | Weling et al. | 438/618 |
| 6,570,248 B1 | 5/2003 | Ahn et al. | 257/724 |
| 6,600,339 B1 | 7/2003 | Forbes et al. | 326/86 |
| 6,692,898 B1 | 2/2004 | Ning | 430/311 |
| 2001/0000428 A1 | 4/2001 | Abadeer et al. | 333/33 |
| 2003/0176023 A1 | 9/2003 | Forbes et al. | 438/186 |
| 2003/0176050 A1 | 9/2003 | Forbes et al. | 438/598 |

OTHER PUBLICATIONS

Johnson, H. W., et al., "High Speed Digital Design", *A Handbook of Black Magic*, Prentice Hall PTR, Upper Saddle River, New Jersey,(1993),pp. 422 & 426.

Lee, K. , et al., "Modeling and Analysis of Multichip Module Power Supply Planes", *IEEE Transactions on Components, Packaging, and Manufacturing Technology, vol. 18, No. 4*, (1995),pp. 628–639.

Rabaey, J. M., *Digital Integrated Circuits, A Design Perspective*, Prentice Hall, Upper Saddle River, New Jersey, ISBN 0–13–178609–1,(1996),pp. 482–493.

Ramo, S. , "Fields and Waves in Communication Electronics", *John Wiley & Sons, Inc., New York, 3rd ed.*, (1994),pp. 428–433.

Rucker, T. G., et al., "A High Performance SI on SI Multichip Module Technology", *1992 Symposium on VLSI Technology, Digest of Technical Papers, IEEE*, Japanese Society of Applied Physics, 1992 Seattle, WA,(Jun. 2–4, 1992),72–73.

Thomas, M. , et al., "VLSI Multilevel Micro–Coaxial Interconnects for High Speed Devices", *IEEE International Electron Devices Meeting*, (1990),55–58.

\* cited by examiner

CAPACITIVE TECHNIQUES TO REDUCE NOISE IN HIGH SPEED INTERCONNECTIONS

FIELD OF THE INVENTION

The present invention relates to integrated circuit devices, and more particularly, to methods and structures using capacitive techniques to reduce noise in high speed interconnections.

BACKGROUND OF THE INVENTION

The metal lines over insulators and ground planes, or metal lines buried in close proximity to dielectric insulators and used for integrated circuit interconnects are in reality transmission lines or strip lines. The use of coaxial interconnection lines for interconnections through the substrate in CMOS integrated circuits can also be termed transmission lines or strip lines. Interconnection lines on interposers or printed circuit boards can also be described as transmission lines.

The low characteristic impedance of any of these lines, transmission, strip lines or coaxial lines results in part from the low characteristic impedance of free space, $Z_o = (\mu_o/\epsilon_o)^{1/2} = 377$ ohms, and in part from the dielectric material used for electrical insulation in the lines which has a higher dielectric permittivity than free space. Most commonly used coaxial lines have an impedance of 50 ohms or 75 ohms, it is difficult to achieve larger values. In the past these effects have not received much consideration on the integrated circuits themselves since the propagation speed with oxide insulators is 15 cm/ns and switching speeds on integrated circuits of the size of a centimeter have been slower than $\frac{1}{15}$ ns or 70 picoseconds. Transmission line effects only become important if the switching time is of the same order as the signal propagation time. Switching times in CMOS circuits have been limited by the ability to switch the capacitive loads of long lines and buffers, and charge these capacitances over large voltage swings to yield a voltage step signal.

Most current CMOS integrated circuit interconnections rely on the transmission of a voltage step or signal from one location to another. FIG. 1 illustrates R-C limited, short high impedance interconnections with capacitive loads. The driver may simply be a CMOS inverter as shown in FIG. 1 and the receiver a simple CMOS amplifier, differential amplifier, or comparator.

As shown in FIG. 1, the CMOS receiver presents a high impedance termination or load to the interconnection line. This is problematic in that:

(i) the switching time response or signal delay is determined mainly by the ability of the driver to charge up the capacitance of the line and the load capacitance, (ii) the line is not terminated by its characteristic impedance resulting in reflections and ringing, (iii) large noise voltages may be induced on the signal transmission line due to capacitive coupling and large voltage swing switching on adjacent lines, the noise voltage can be a large fraction of the signal voltage.

The transmission of voltage step signals only works well if the interconnection line is short so that the stray capacitance of the line is small. Long lines result is slow switching speeds and excessive noise due to capacitive coupling between lines.

FIG. 1 shows the commonly used signal interconnection in CMOS integrated circuits, where voltage signals are transmitted from one location to another. This is problematic in that the interconnection lines are normally loaded with the capacitive input of the next CMOS stage and the large stray capacitance of the line itself. The response time is normally slow due to the limited ability of the line drivers to supply the large currents needed to charge these capacitances over large voltage swings. These times are usually much larger than the signal transmission time down the line so a lumped circuit model can be used to find the signal delay, as shown in FIG. 1.

In the example here the output impedance of the source follower is 1/gm=1000 ohms, and a line 0.1 cm long will have a capacitance of about 0.2 pF if the dimensions of the line are about 1 micron by 1 micron and the insulator or oxide thickness under the line is 1 micron. This results in a time constant of 200 pS and it takes about 400 pS to charge the line from 10% to 90% of the final voltage value. This is a relatively slow response.

Furthermore, if two interconnection wires are in close proximity then the voltage swing on one line can induce a large voltage swing or noise voltage on the adjacent line as shown in FIG. 1. The noise voltage is just determined by the capacitance ratios, or ratio of interwire capacitance, Cint, to the capacitance of the interconnection wire, C.

In prior art these can be comparable, as shown, and depend on the insulator thickness under the wires and the spacing between the wires. Therefore, the noise voltage can be a large fraction of the signal voltage if the wires are in close proximity and far removed from the substrate by being over thick insulators. The emphasis in prior art has always been in trying to minimize the capacitance of the interconnection line, C, by using thick insulators and low dielectric constant materials.

Thus, there is a need to provide a solution for these types of problems for CMOS-scaled integrated circuits. Due to the continued reduction in scaling and increases in frequency for transmission lines in integrated circuits such solutions remain a difficult hurdle. For these and other reasons there is a need to reduce noise in high speed interconnections.

SUMMARY OF THE INVENTION

The above mentioned problems with transmission lines in CMOS integrated circuits and other problems are addressed by the present invention and will be understood by reading and studying the following specification. Structures and methods are described which accord improved benefits.

Improved methods and structures are provided for using capacitive techniques to reduce noise in high speed interconnections, such as those used in CMOS integrated circuits. The present invention also offers a reduction in signal delay. Moreover, the present invention further provides a reduction in skew and crosstalk. Embodiments of the present invention also provide the fabrication of improved transmission lines for silicon-based integrated circuits using conventional CMOS fabrication techniques.

One embodiment of the invention includes a method for forming transmission lines in an integrated circuit. The method include forming a first layer of electrically conductive material on a substrate. The method includes forming a first layer of insulating material on the first layer of the electrically conductive material. The first layer has a thickness of less than 1.0 micrometers (μm). A transmission line is formed on the first layer of insulating material. The transmission line has a thickness and a width of approximately 1.0 micrometers. A second layer of insulating material is formed on the transmission line. And, a second layer of electrically conductive material is formed on the second layer of insulating material.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
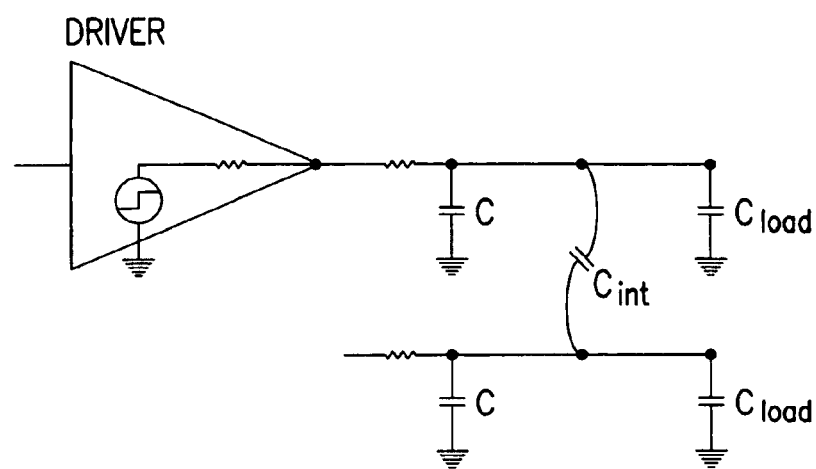
FIG. 1 shows the commonly used signal interconnection in CMOS integrated circuits, where voltage signals are transmitted from one location to another.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
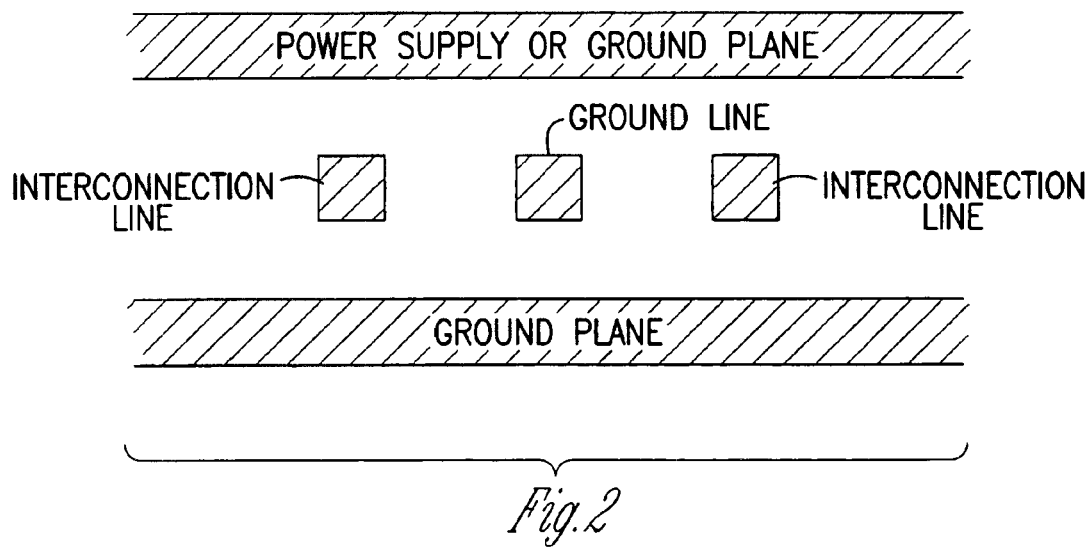
FIG. 2 illustrates one technique to minimize the interwire capacitance, Cint, by using an intermediate line at ground for shielding.

FIG. 2 illustrates one technique to minimize the interwire capacitance, Cint, by using an intermediate line at ground for shielding. This technique is disclosed in a copending application by a common inventor, Dr. Leonard Forbes, entitled "Novel Transmission Lines for CMOS Integrated Circuits," Ser. No. 09/364,199. The same is incorporated herein by reference.

Also, as disclosed in issued U.S. Pat. No. 6,255,852 by Dr. Leonard Forbes, entitled "Current Mode Interconnects on CMOS Integrated Circuits," low impedance transmission lines such as those which exist on CMOS integrated circuits are more amenable to signal current interconnections over longer interconnection lines. U.S. Pat. No. 6,255,852 is incorporated herein by reference. These longer interconnection lines may be on the CMOS integrated circuit itself, an interconnection line between integrated circuits mounted in a module as for instance a memory module, an interposer upon which these integrated circuits are mounted, or on a printed circuit board upon which the integrated circuits are mounted. If the line is terminated with a low input impedance current sense amplifier then the line can be regarded as a transmission line terminated with the characteristic impedance of the interconnection line. This is advantageous in that:

(i) the signal delay depends only on the velocity of light on the line and is easily predictable and reproducible, eliminating or allowing for compensation for signal and/or clock skew, (ii) there are no reflections at the receiving end of the line and this minimizes ringing, (iii) noise signals will be smaller due to weaker coupling between lines resulting in better signal to noise ratios, the noise current will only be a small fraction of the signal current. The transmission of current signals rather than voltage signals is more desirable at high speeds, and in high speed or high clock rate circuits over longer interconnection lines. A CMOS circuit might for instance use a combination of techniques, conventional voltage signals over short interconnections with little coupling between lines and current signals over longer interconnections and where lines might be in close proximity.

Figure 3A:
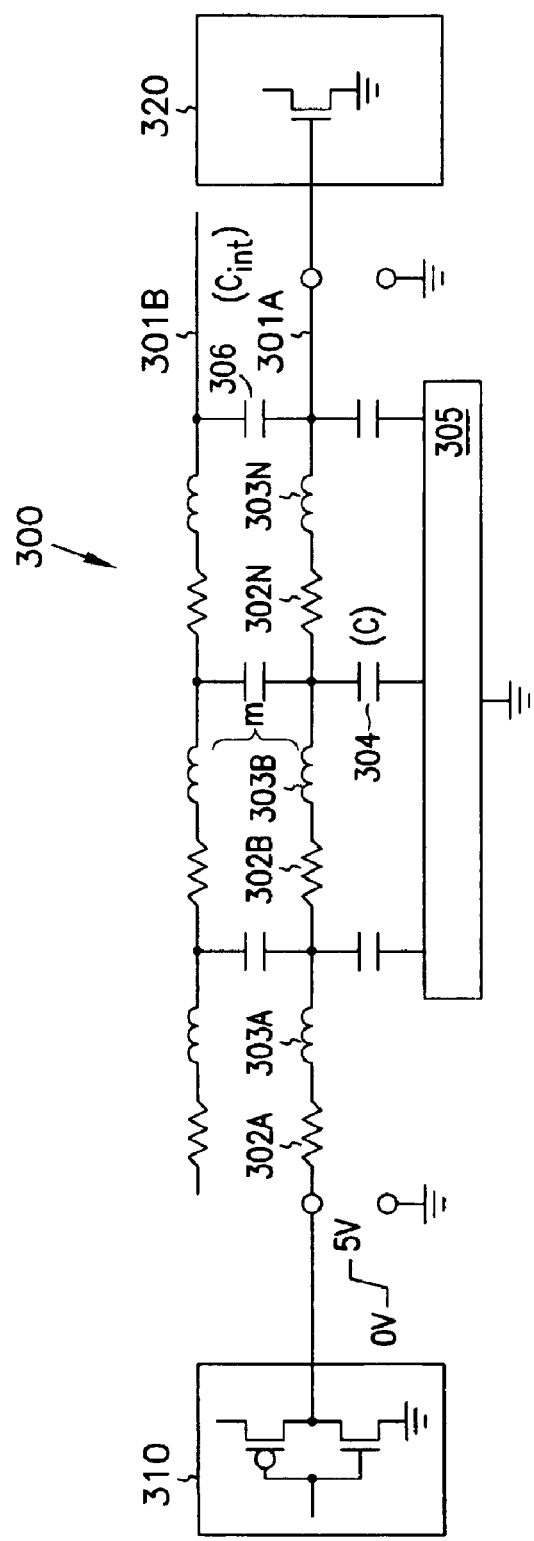
FIG. 3A illustrates signal transmission using correctly terminated transmission lines and current sense amplifiers, according to the teachings of the present invention.

FIG. 3A illustrates capacitive coupling between low impedance terminated interconnection lines. FIG. 3A illustrates signal transmission using correctly terminated transmission lines and current sense amplifiers, such as those disclosed in issued U.S. Pat. No. 6,255,852 by Dr. Leonard Forbes, entitled "Current Mode Interconnects on CMOS Integrated Circuits." The signal interconnection or transmission line is terminated by the matching impedance of the current sense amplifier. This means the impedance looking into the sending end of the transmission line will just be the characteristic impedance of the line and the signal delay down the line will just be the small propagation delay down the line. The response time of the source follower being used as a line driver will be determined primarily by the longer rise time of the input voltage. This driver will supply a current whose rise time is basically just that of the input voltage. This driver will then supply a signal current whose rise time is basically just that of the input voltage signal.

FIG. 3A also illustrates the coupling to another signal line in close proximity, in this case the coupling will be both magnetic through the induced magnetic fields and mutual inductance and capacitive coupling. The noise current induced will be shown to be only a fraction of the signal current or the signal to noise ratio is high. Once received this signal current is converted back to a signal voltage by the current sense amplifier at the receiving end of the line. Since the signal propagation time is small, the signal delay time will in practice be limited by the rise time of the signal to the gate of the source follower. Since the gate capacitance of the source follower is small this can be very fast.

Conventional methods to minimize capacitive coupling between lines have been to use low dielectric constant materials or insulators, or ground shields. In the present invention, it is desirable to use very low impedance lines it is desirable to keep the capacitive coupling between lines small and the magnitude of voltage steps on the interconnection lines small. The current step will induce a voltage step at the load which is the magnitude of the load impedance times this current step. This voltage step while small, 1 mA times Zin in this example, still can induce a capacitively coupled noise signal on an adjacent line.

FIG. 3A shows an integrated circuit 300 in which a first transmission line, strip line, or coaxial line 301A interconnects circuit components, e.g. a driver 310 to a receiver 320. FIG. 3A illustrates a first transmission line 301A over a conductive substrate 305. Conventionally, a voltage signal (i.e. a 5 volt signal swing) is provided by the driver 310 to the transmission line 301A. The schematic illustrations in FIG. 3A demonstrate that the transmission line 301A includes a small resistance, shown generally by resistor symbols 302A, 302B, . . . , 302N. Also, the transmission line 301A includes a distributed inductance (L) which is represented generally by inductor symbols 303A, 303B, . . . , 303N. In one embodiment, the driver 310 may be an inverter 310 and the receiver 320 may be an amplifier 320. Capacitor plate symbols 304 (C) are used to schematically represent the capacitive coupling which occurs between the transmission line 301A and the conducting substrate 305. In FIG. 3A, a second transmission line 301B is shown. Capacitor plate symbols 306 are used to schematically represent the capacitive coupling (Cint) which similarly occurs between the first transmission line 301A and neighboring transmission lines, e.g. second transmission line 301B.

Figure 3B:
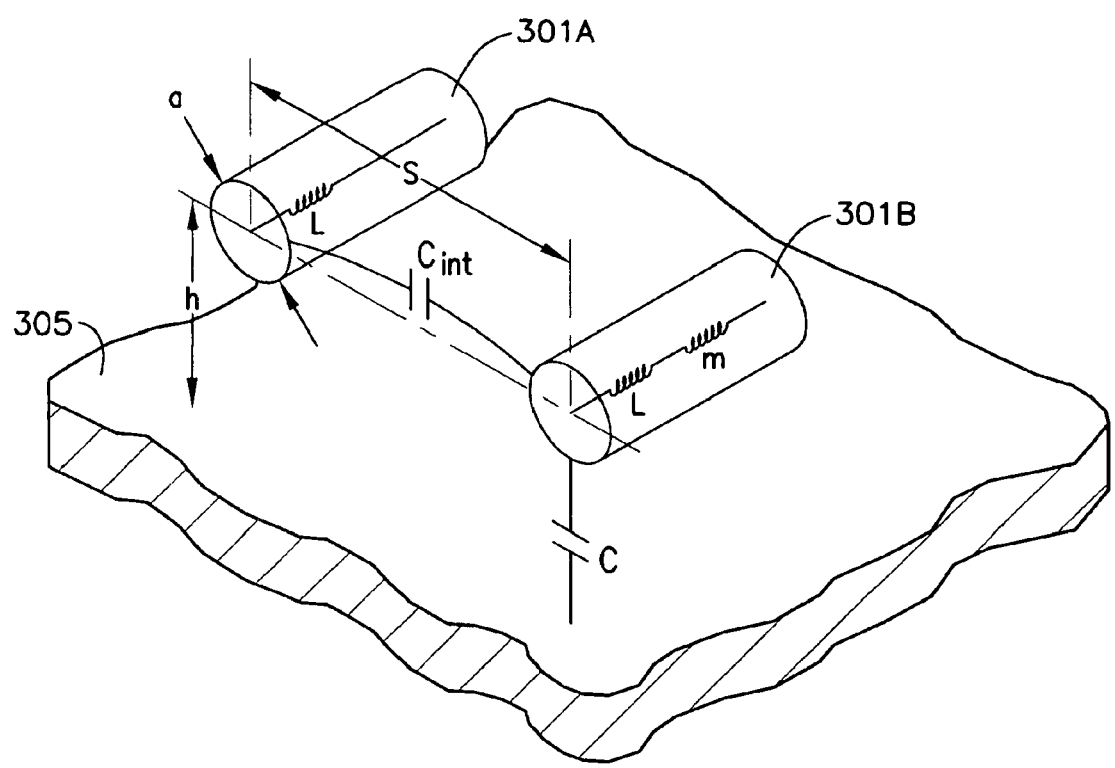
FIG. 3B illustrates two interconnection lines in close proximity and the interwire capacitance between these lines and the mutual inductance coupling between the lines.

FIG. 3B illustrates two interconnection lines in close proximity and the interwire capacitance between these lines and the mutual inductance coupling between the lines. (See generally, H. Johnson, "High-Speed Digital Circuits: A Handbook of Black Magic," Prentice-Hall, 1993; and S. Ramo, J. R. Whinnery and T. Van Duzer, "Fields and Waves in Communication Electronics, 3rd Ed.," John Wiley, New York, 1994). Although the interconnection lines on integrated circuits might tend to be more square than round, the concepts involved can be most conveniently described and formulas approximated by assuming for simplicity that the lines are round or circular. Approximate formulas have been developed describing round wires over conductive planes or two wires in close proximity, in this case they are interconnection wires on a CMOS integrated circuit, interposer, or printed circuit board.

In FIG. 3B the illustrated pair of interconnect, or transmission lines, 301A and 301B, displayed in a perspective view, are separated from a conducting substrate 305. The transmission lines, 301A and 301B are spaced a distance (h) from the conducting substrate 305 and a distance (s) from one another. The transmission lines, 301A and 301B, are shown in a circular geometry, each with a diameter (a). Some general characterizations can be made about the transmission lines, 301A and 301B, in an environment floating or suspended in air. First, each transmission line, 301A and 301B, will have a characteristic impedance in air ($Z_0$) approximately or generally given by $Z_0 \cong 60 \ln (4 h/a)$. Second, each transmission line, 301A and 301B, has a inductance (L) which is $L \cong 5.08 \times 10^{-9} \times \ln (4 h/a)$ Henrys/inch (H/inch). Additionally, the two transmission lines, 301A and 301B, will exhibit an interwire mutual inductance (M) which is given by $M = L \times \{1/[1+(s/h)^2]\}$. Third, an interwire capacitive coupling (Cint) exists between the two transmission lines, 301A and 301B, and is expressed as $Cint = \pi \epsilon / \cosh^{-1}(s/a)$. Using the trigonometric relationship of $\cosh^{-1}(y) \cong \ln(2y)$, the interwire capacitive coupling can similarly be expressed as $Cint \cong \pi \epsilon / \ln (2s/a)$. Thus, in this environment, the two transmission lines, 301A and 301B, exhibit an interline capacitance (Cint) given by $Cint = \{0.7/[\ln (2 s/a)]\}$ pico Farads/inch (pF/inch). Lastly, each transmission line, 301A and 301B, will further exhibit capacitive coupling C with the conducting substrate 305.

Again, in FIG. 3B the transmission lines, 301A and 301B, are spaced a distance (h) from the conducting substrate 305. Using the method of images and the interwire capacitive relationship, $Cint \cong \pi \epsilon / \ln (2 s/a)$, a single transmission line, 301A, over a conducting substrate is given by $C \cong 2 \pi \epsilon / \ln (4 h/a)$ pF/inch where h=s/2. Thus, in this environment, the two transmission lines, 301A and 301B, exhibit a capacitance, or capacitive coupling C with the conductive substrate 305 which is $C \cong \{1.41/[\ln (4 h/a)]\}$ pF/inch. The above equations have been presented by assuming that the transmission lines have round or circular geometries. Actual transmission lines on integrated circuits might tend to be more square or rectangular than round due to present lithography techniques. Nevertheless, due to the actual physical size of transmission lines, determined according to minimum lithographic feature techniques, the formulas scale well to square, rectangular or other physical cross sectional geometries for the transmission lines.

The signal rise time (trise) in conventional voltage signaling is normally slow due to the limited ability of the transmission line drivers to supply the large currents needed to charge these capacitances over large voltage swings. The signal rise times are usually much larger than the signal transmission time down the line (tprop). Additionally, if two transmission lines are in close proximity then the voltage swing on one transmission line can induce a large voltage swing or noise voltage on the adjacent transmission line. The noise voltage is determined by the capacitance ratios of interwire capacitance, Cint, to the capacitance of the transmission line with the substrate, C. In other words, the noise voltage is determined according to the ratio Cint/C.

The values of Cint and C can be comparable, dependant upon the insulator thickness (h) under the transmission lines and the spacing between the transmission lines. Emphasis in prior art is placed upon minimizing the capacitance of the transmission line, C, by using thick insulators and low dielectric constant materials. Emphasis is also to some extent placed upon minimizing the interwire capacitance, Cint. Thus, the approach in the prior art results in a noise voltage which can be a large fraction of the signal voltage if the transmission lines are in close proximity and far removed from the substrate by being over thick insulators.

Figure 4:
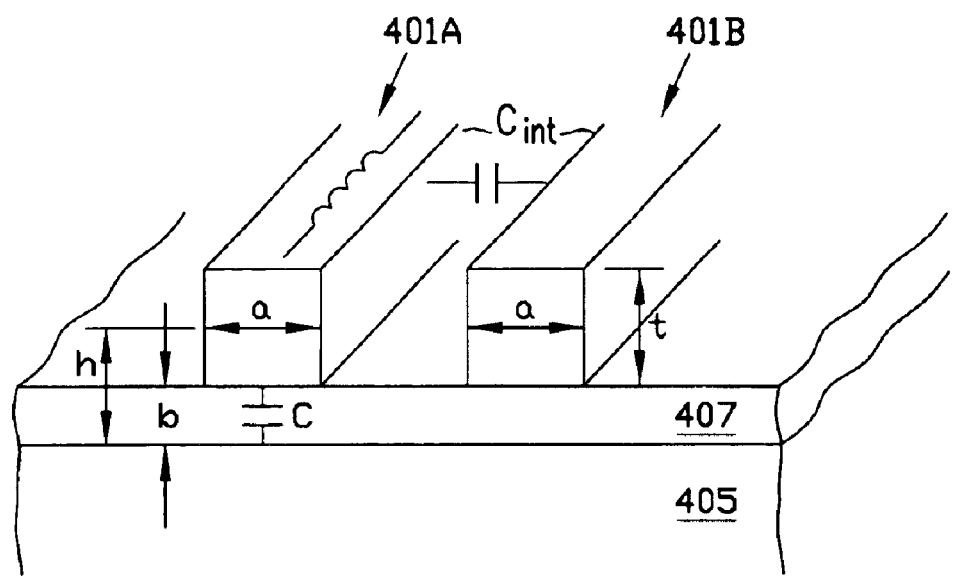
FIG. 4 is a perspective view illustrating a pair of neighboring transmission lines above a conductive substrate, according to the teachings of the present invention.

FIG. 4 is a perspective view illustrating a pair of neighboring transmission lines, 401A and 401B, above a conductive substrate 405 according to the teachings of the present invention. The present invention is designed to use current signaling across low impedance transmission lines, 401A and 401B, to reduce signal transmission delay and to improve signaling performance over longer transmission lines. Under conventional voltage signaling the current provided in the transmission lines is too weak to provide clean, accurately detectable current signal. In order to obtain better current signals in the transmission lines the signal to noise ratio of the transmission lines, 401A and 401B, must be improved.

To improve the signal to noise ratio of the transmission lines, 401A and 401B, the capacitance coupling between the transmission lines, 401A and 401B, and the conductive substrate 405, is made large. The characteristic impedance (Zo) of the transmission lines, 401A and 401B, can be expressed as $Z_0 = \sqrt{L/C}$. Thus, making C large makes the characteristic impedance Zo=Zin, small and similarly makes the voltage division ratio for capacitive coupling small. In the present invention, C increases as the insulator 407 thickness (h) separating the transmission lines, 401A and 401B, from the ground plane, or substrate 405 is decreased. In FIG. 4, the transmission lines, 401A and 401B, are separated a distance (h) from the conducting substrate 405 by an insulating layer 407. In one embodiment, the insulating layer 407 is an oxide layer 407. The capacitive coupling C between the transmission lines, 401A and 401B, and the conducting substrate 405 separated by an oxide layer 407 is given as $C \cong 1.66/[\ln(4\ h/a)]$ pF/cm. Additionally, the inductance (L) for the transmission lines, 401A and 401B, over the oxide layer 407 is $L \cong 2 \times \ln(4\ h/a)$ nanoHenrys/centimeter (nH/cm). The transmission lines, 401A and 401B, are shown in a square geometry having a width (a). The insulator 407 has a thickness (b) separating the transmission lines 401A and 401B from the substrate. 405. According to the teachings of the present invention, the insulator thickness (b) is made thinner than the thickness (t) of the transmission lines, 401A and 401B. The center of the transmission lines, 401A and 401B, are a distance (h) above the conducting substrate 405. Unlike prior art where the emphasis is placed upon on minimizing transmission line capacitance (C), the opposite is true here where the emphasis is on minimizing characteristic impedance ($Z_0$) by making the capacitance of the lines, 401A and 401B large and thus improving the signal to noise ratio.

According to the teachings of the present invention, in one embodiment the thickness (b) of the insulator is equal to or less than 1.0 micrometers (μm). In one embodiment, the thickness (t) of the of the transmission lines, 401A and 401B is equal to or greater than 1.0 micrometers (μm). In one embodiment, the thickness (t) of the transmission lines, 401A and 401B is approximately 1.0 (μm). In one embodiment, the width (a) of the transmission lines, 401A and 401B is approximately 1.0 micrometers (μm). As one of ordinary skill in the art will appreciate upon reading the present disclosure, one embodiment of the present invention includes transmission lines 401A and 401B formed according to the above described dimensions and separated from the substrate 405 by an insulator having a thickness (b) of less than 1.0 micrometers (μm). In one exemplary embodiment, the transmission lines 401A and 401B have an input impedance ($Z_0$) approximately equal to 50 ohms.

Figure 5:
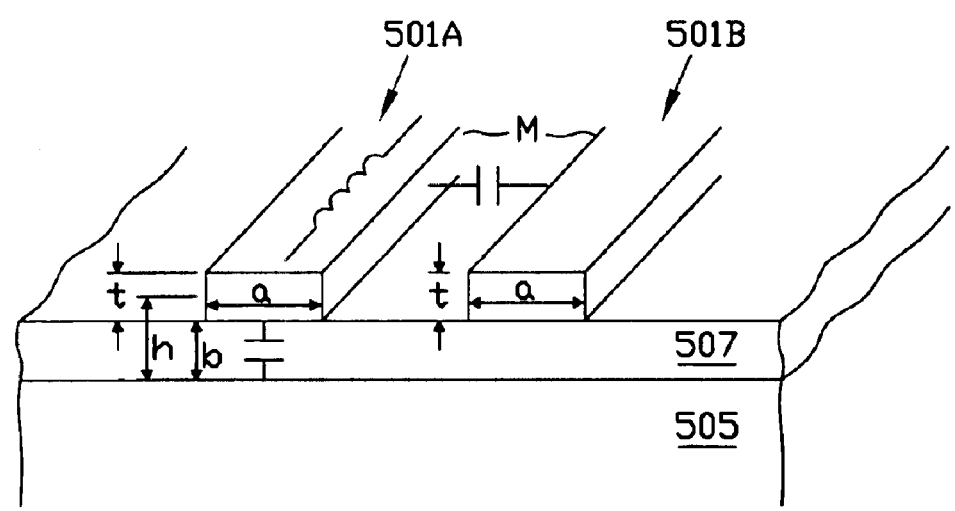
FIG. 5 is a perspective view illustrating another embodiment for a pair of neighboring transmission lines above a conductive substrate, according to the teachings of present invention.

FIG. 5 is a perspective view illustrating another embodiment for a pair of neighboring transmission lines, 501A and 501B, above a conductive substrate 505, according to the teachings of present invention. In this embodiment, a thickness (t) for each of the transmission lines, 501A and 501B, is less than the width (a) of the transmission lines, 501A and 501B. In this embodiment, the reduced thickness (t) of the transmission lines, 501A and 501B further minimizes interwire capacitive coupling (Cint). Again, as in FIG. 5C, the insulator 507 thickness (b) over the substrate 505 is made small to increase the capacitive coupling C between the transmission lines, 501A and 501B, and the substrate 505. In one embodiment, the width (a) of the transmission lines, 501A and 501B, is approximately 1.0 micrometers (μm) and the thickness (b) of the insulator layer 507 is equal to at most ¾ of the width (a) of the transmission lines, 501A and 501B. The center of the transmission lines, 501A and 501B, are a distance (h) above the conducting substrate 505. Correspondingly, the characteristic impedance Zo of the transmission lines, 501A and 501B, is reduced as Zo is dependent upon C. The transmission lines, 501A and 501B, have a low characteristic impedance ($Z_0$) and an improved signal to noise ratio. In one embodiment, the characteristic impedance Zo of the transmission lines, 501A and 501B, is approximately 30 Ohms. The current steps produced by a driver will induce a voltage step at the load which is the magnitude of the load impedance Zo times this current step. If a 1 mA current is provided to the transmission lines, 501A and 501B, a 30 mV step results on the transmission lines, 501A and 501B.

This embodiment, also results in a fast time constant (RC or ZoC) on the transmission lines, 501A and 501B. In one exemplary embodiment, each transmission line, 501A and 501B, has a length (l) of 0.1 cm or 1000 μm, each has a width (a) of approximately 1.0 μm, h is 0.68 μm, and the insulator layer thickness (b) is approximately 0.2 μm. In this embodiment, the ln(4 h/a) will be approximately 1. Thus, $C \cong 1.66/[\ln(4\ h/a)]$ pF/cm for a line of 0.1 cm will produce $C \cong 0.2$ pF. If Zo is approximately 30 Ohms, then the time constant (ZoC) is approximately 6 pico seconds (ps). Thus, the low impedance transmission lines, 501A and 501B of the present invention keep the magnitude of the voltage steps on the transmission lines, 501A and 501B, small and the response time (tprop) rapid.

As one of ordinary skill in the art will understand upon reading this disclosure, in both embodiments of FIGS. 4 and 5 a characteristic impedance of 50 ohms on a given transmission line is easily realizable which results in a 50 mV step on one line. Thus, in the invention, the capacitance division ratio might easily be small, C=1 pF, Cint=0.06 pF, resulting in a small noise signal on an adjacent transmission line. The time constant of a second, neighboring transmission line is fast, 50 ohms times 1 pF, and 50 picoseconds. This means the noise current on the second line (Cint)×(50 mV/100 pS) or 0.03 mA. This is only a small percentage of the signal current and again the signal to noise ratio will be large. It can be shown in general the signal to noise ratio due to capacitive coupling is of the order (C/Cint) (trise/tprop); where, trise, is the rise time on the current signal and, tprop, the signal propagation time down the line.

In summary, when transmission line effects become important on integrated circuits interconnections at high switching speeds then limiting cross coupling and interconnection noise is just not simply a matter of limiting the ratio of the stray capacitance to line capacitance, Cint/C. In other words, solely using a shielding technique as shown in FIG. 2 for R-C limited lines or for low impedance lines does not always suffice. In the present invention, capacitive coupling effects can be minimized by:

(i) using low impedance lines and maximizing line capacitance to ground planes as shown in FIG. 4, and (ii) geometry, that is by making the lines wide and thin as shown in FIG. 5.

Figure 6:
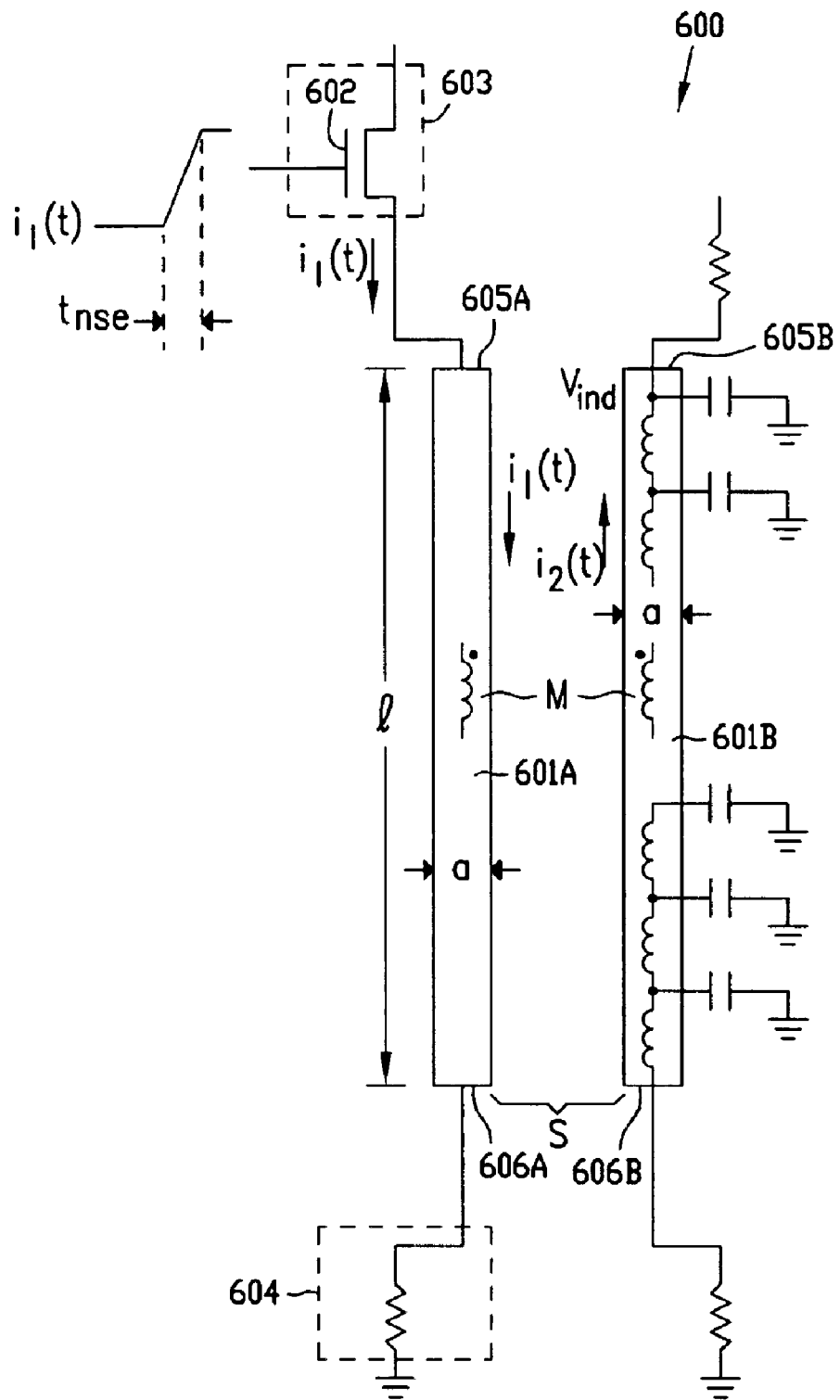
FIG. 6 is a schematic diagram for an interconnection on an integrated circuit 600 according to the teachings of the present invention.

FIG. 6 is a schematic diagram for an interconnection on an integrated circuit 600 according to the teachings of the present invention. The interconnection on the integrated circuit 600 includes a pair of transmission lines, 601A and 601B, in close proximity. The first transmission line 601A is separated by a distance (s) from the second transmission line 601B. The first transmission line 601A and the second transmission line 601B each have a first end, 605A and 605B respectively. In one embodiment, the first end 605A for the first transmission line 601A is coupled to a driver 603. The first transmission line 601A and the second transmission line 601B each have a second end, 606A and 606B respectively. In one embodiment, the second end 606A is coupled to a termination 604 formed using a complementary metal oxide semiconductor (CMOS) process.

Reference to FIG. 6 is useful in explaining the reduced amount of noise current between two transmission lines, 601A and 601B, using the current signaling technique of the present invention. In one embodiment of the present invention, transmission lines, 601A and 601B, have a low characteristic impedances Zo. In one embodiment, the input impedance (Zin) seen by the driver 603 coupling to the first transmission line 601A (in this example the "driven line") is just the characteristic impedance Zo for the first transmission line 601A. In other words, the CMOS termination 604 is impedance matched to the characteristic impedance Zo of the transmission line 601A.

In one embodiment, the first transmission line 601A is separated by approximately 3 μm from the second transmission line 601B and the transmission lines have a length (l) of at least 500 μm. In another embodiment the transmission lines, 601A and 601B, have a length (l) of at least 0.1 cm, or 1000 μm. As in FIGS. 4 and 5, the transmission lines, 601A and 601B, are separated from a conducting substrate by an insulating layer. In one embodiment, the insulating layer is an oxide layer. In this embodiment, the capacitive coupling C between the transmission lines, 601A and 601B, and the conducting substrate is given as $C \cong 1.66/[\ln(4\ h/a)]$ pF/cm. In one exemplary embodiment, each transmission line, 601A and 601B, has a length (l) of 0.1 cm or 1000 μm, each has a width (a) of approximately 1.0 μm, and the insulator layer thickness (b) is approximately 0.2 μm. In this embodiment, the $\ln(4\ h/a)$ will be approximately 1. Thus, $C \cong 1.66/[\ln(4\ h/a)]$ pF/cm and for a line 0.1 cm long will produce a $C \cong 0.2$ pF. In the same embodiment, the inductance (L) for the transmission lines, 601A and 601B, over the oxide layer is $L \cong 2 \times \ln(4\ h/a)$ nH/cm, or L=0.2 nH for a line 0.1 cm long. In this embodiment, a 1 milli Ampere (mA) current step, $i_1(t)$, is applied to the gate 602 of a transistor driver 603. In one embodiment, the driver is an n-channel source follower driver 603. In this embodiment, the rise time (trise) on the gate 602 of the driver 603 is approximately 100 ps. This is the limiting time on the system response since the signal delay (tprop) down a the transmission line is proportional to $\sqrt{LC}$. For a 0.1 cm transmission line, 601A or 601B, tprop is only 7 ps. A current, $di_1(t)/dt$, of approximately $1 \times 10^7$ A/sec is then produced on the first transmission line 601A.

The noise current $i_2(t)$ induced on the second transmission line 601B by interwire capacitive coupling (Cint) is calculated as approximately $i_2(t)=(Cint) \times (V_1 step/trise)$. The interwire capacitive coupling (Cint) between the transmission lines, 601A and 601B, separated by an oxide dielectric can be expressed as Cint=0.46 pF/cm. Again, for a 0.1 cm transmission line, 601A or 601B, Cint≅0.05 pF. As described in connection with FIG. 5, a 1 mA current provided to the first transmission line 601A having a low characteristic impedance Zo of approximately 30 Ohms will result in a corresponding 30 mV Voltage step ($V_1$step) on the first transmission line 601A. Therefore, if trise is 100 ps a noise current, $i_2(t)$, of approximately 0.015 mA is produced on the second, neighboring, transmission line 601B. This noise current, $i_2(t)$, induced in the second transmission line 601B is a very small percentage, or about 1%, of the signal current $i_1(t)$ provided to the first transmission line 601A. Hence, the signal to noise ratio (SNR) will be large. It can be shown, in general, that a signal to noise ratio (SNR) for the present invention, due to capacitive coupling is of the order (C/Cint)(trise/tprop); where, trise, is the rise time for the current signal and, tprop, the signal propagation time down the first transmission line 601A. The rise time on the signal current, $i_1(t)$, in the first transmission line 601A is fast and just follows the rise time (trise) on the input signal, or 100 ps. The response time of this system utilizing current signals is thus much faster than those using voltage signals.

Reference to FIG. 6 is similarly useful to illustrate the noise voltage signal from magnetic coupling induced in the second transmission line 601B by the signal current in the first transmission line 601A. As shown in FIG. 6, a voltage will be induced in the second transmission line 601B which has a magnitude that depends on the trise, $di_1(t)/dt$, of the current $i_1(t)$ in the driven transmission line 601A, and the mutual inductance coupling (M) between neighboring transmission lines, e.g. 601A and 601B. Each transmission line, 601A and 601B, has an inductance (L). As stated above, L≅0.2 nH for a 0.1 cm transmission line, 601A and 601B. In one exemplary embodiment, the current $i_1(t)$ in the first transmission line, 601A (in this example the "driven line") rises to 1 mA in 100 ps. A current, $di_1(t)/dt$, of approximately $1 \times 10^7$ A/sec is then produced on the first transmission line 601A. As presented above in connection with FIG. 3A and 3B, the mutual inductance coupling (M) can be expressed as $M=L \times \{1/[1+(s/h)^2]\}$. In one exemplary embodiment, s is approximately equal to 3 μm, and h is approximately equal to 0.7 μm. In this embodiment, M will equate to approximately M=0.02 nano Henrys (nH).

Using the relationship that the induced voltage (Vind)= $M \times di_1(t)/dt$, Vind is approximately equal to 0.2 mV. During this 100 ps time period the induced voltage traveling down the second transmission line 601B just sees the characteristic impedance Zo of the second transmission line 601B. In one embodiment Zo is approximately 30 Ohms, so here, the current induced $i_2(t)$ in the second transmission line is $i_2(t)$=Vind/Zo or 0.007 mA. This low value current is only approximately one percent (1%) of the signal current $i_1(t)$ on the first transmission line, 601A. Hence, a large signal to noise ratio (SNR) results. In contrast, under the prior technology, if high impedance capacitive loads had been used on high characteristic impedance lines and conventional voltage signaling employed there is typically a large noise voltage between the neighboring transmission lines, 601A and 601B. In the prior technology, the large noise voltage can be about one half as big as signal voltages.

The second transmission line 601B has an equivalently rapid time constant, (L/R) to that of the first transmission line 601A. In the embodiment presented above, the time constant is approximately 7 pico seconds (ps). The noise current $i_2(t)$ in the second transmission line 601B will reach a steady state in that time constant. The noise current stays at this steady state value until the end of trise, in this embodiment 100 ps, at which point $i_1(t)$ stops changing. After this, the noise current in the second line decays away very quickly. Again, when the input impedance seen by the driver 603 is matched to the characteristic impedance Zo of the first transmission line 601A, the signal to noise ratio (SNR) due to inductive coupling between the first transmission line 601A and the second, or neighboring, transmission line 601B is of the order, (L/M) (trise/tprop). In other embodiments, the actual mutual inductance and self inductances may vary from these given values without departing from the scope of the invention.

FIGS. 7A–7F illustrate an embodiment of a process of fabrication of transmission lines in an integrated circuit according to the teachings of the present invention. The sequence of the process can be followed as a method for forming integrated circuit lines and as a method for forming transmission lines in a memory device.

Figure 7A:
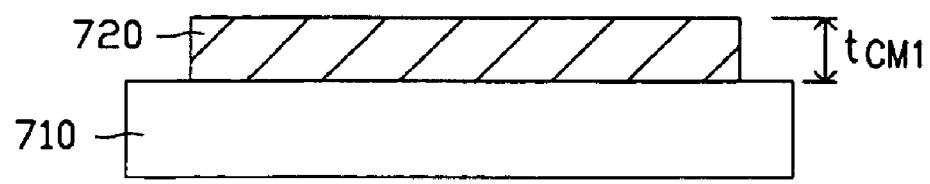
FIGS. 7A–7F illustrate an embodiment of a process of fabrication of transmission lines in an integrated circuit according to the teachings of the present invention.

FIG. 7A shows the structure after the first sequence of processing. A first layer of electrically conductive material 720 is formed on a substrate 710. The first layer of electrically conductive material 720 is formed on the substrate 710 by depositing a conducting film of high conductivity using a technique such as evaporation, sputtering or electroplating. In one embodiment, the first layer of electrically conductive material 720 is a ground plane. In an alternative embodiment, the first layer of electrically conductive material 720 is a power plane. In a further embodiment, the first layer of electrically conductive material 720 has a thickness ($t_{CM1}$) of approximately 3 to 5 micrometers (µm). In further embodiments, the first layer of electrically conductive material 720 is coupled to a power supply or a ground potential, allowing this layer to function as a direct current (DC) bus. In one embodiment, the first layer of electrically conductive material 720 includes copper. In another embodiment, the first layer of electrically conductive material 720 includes aluminum. In still another embodiment, the first layer of electrically conductive material 720 includes any other suitably conductive material. In one embodiment, the substrate 710 is a bulk semiconductor (e.g., material from the Si, SiGe and GaAs family). In an alternative embodiment, the substrate 710 is an insulator material. In another embodiment, the substrate 710 is a SOI (Silicon-On-Insulator) material.

Figure 7B:
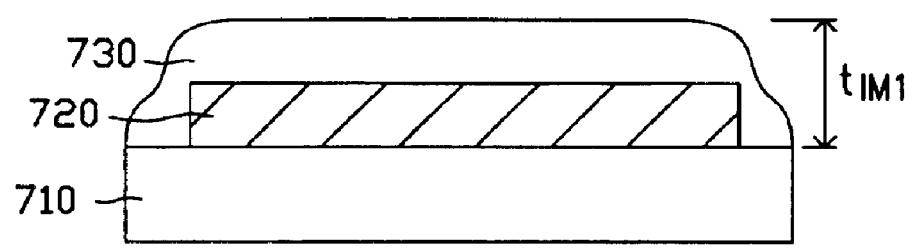

FIG. 7B illustrates the structure following the next sequence of processing. A first layer of insulating material 730 is formed on the first layer of electrically conductive material 720. In one embodiment, the first layer of insulating material 730 is formed by chemical vapor deposition (CVD). In one embodiment, the first layer of insulating material 730 is an oxide layer (e.g., $SiO_2$). In an alternative embodiment, the first layer of insulating material 730 is an insulator with having a dielectric constant equivalent to or greater that a dielectric constant of $SiO_2$. According to the teachings of the present invention, the first layer of insulating material 730 has a thickness ($t_{IM1}$) of less than 1.0 µm.

Figure 7C:
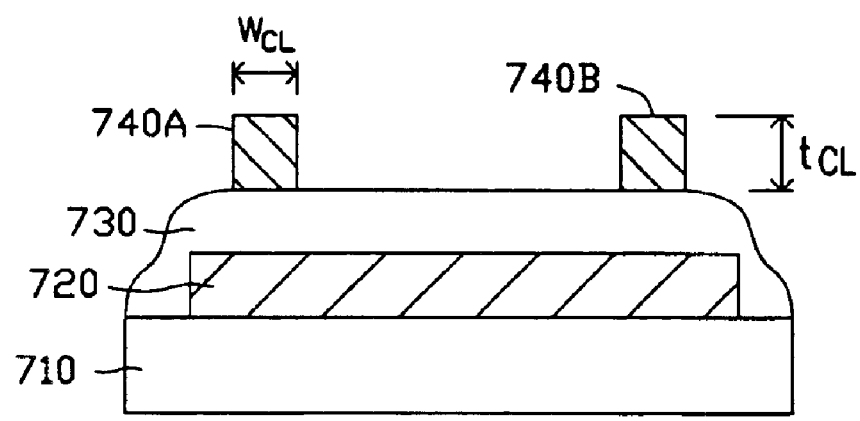

FIG. 7C illustrates the structure following the next sequence of processing. A pair of electrically conductive lines 740A and 740B are formed on the first layer of insulating material 730. In one embodiment, the pair of electrically conductive lines 740A and 740B have a width ($W_{CL}$) which is approximately equal to 1.0 micrometers (µm). However, the invention is not so limited. In one embodiment, the thickness ($t_{CL}$) of the electrically conductive lines, 740A and 740B is equal to or less than 1.0 micrometers (µm). As one of ordinary skill in the art will appreciate upon reading the present disclosure, one embodiment of the present invention includes electrically conductive lines 740A and 740B formed according to the above described dimensions and separated from the substrate by an insulator having a thickness (b) of less than 1.0 micrometers (µm). In one embodiment, the pair of electrically conductive lines 740A and 740B are formed using optical lithography followed by an additive metallization, such as lift-off evaporation or electroplating, both of which are low-temperature processing.

Figure 7D:
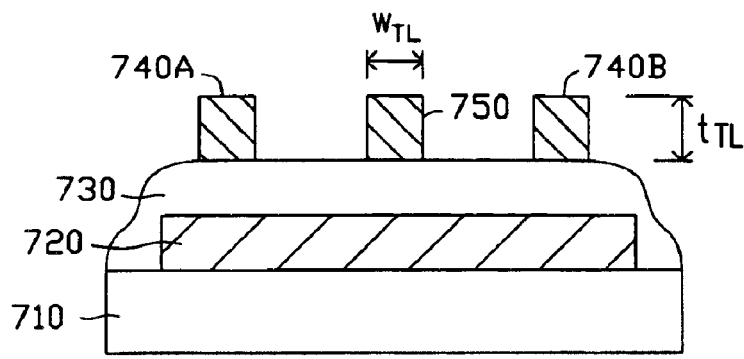

FIG. 7D illustrates the structure following the next sequence of processing. A transmission line 750 is formed on the first layer of insulating material 730. In particular, the transmission line 750 is formed between and in parallel with the pair of electrically conductive lines 740A and 740B. In one embodiment, the transmission line 750 has a width ($W_{TL}$) which is approximately equal to 1.0 micrometers (µm). However, the invention is not so limited. In one embodiment, the transmission line 750 is formed with a thickness ($t_{TL}$) of 1.0 micrometers (µm) or less. In one embodiment, the transmission line 750 is formed according to embodiments described in application Ser. No. 09/247,680, entitled "Current Mode Signal Interconnects and CMOS Amplifier," filed on Feb. 9, 1999. Similar to the processing of FIG. 7C, the transmission line 750 can be formed using optical lithography followed by an additive metallization, such as lift-off evaporation or electroplating, both of which are low-temperature processing.

Figure 7E:
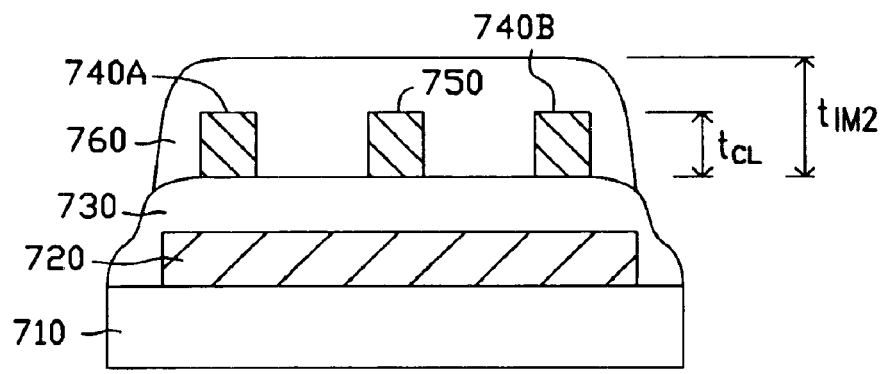

FIG. 7E illustrates the structure following the next sequence of processing. A second layer of insulating material 760 is formed on the pair of electrically conductive lines 740A and 740B and the transmission line 750. In one embodiment, the second layer of insulating material 760 is formed by chemical vapor deposition (CVD). In one embodiment, the second layer of insulating material 760 is an oxide layer (e.g., $SiO_2$). In an alternative embodiment, the second layer of insulating material 760 is an insulator having a dielectric constant which is equivalent to or greater than $SiO_2$. In yet another embodiment, the second layer of insulating material 760 is an insulator having a dielectric constant which is less than that of $SiO_2$. In one embodiment of FIG. 7E, the second layer of insulating material 760 has a thickness ($t_{IM2}$) which is at least 50% greater than a thickness ($t_{CL}$) of the pair of electrically conductive lines 740A and 740B and the transmission line 750. Advantageously, this level of thickness insures step coverage at the conductor corners.

Figure 7F:
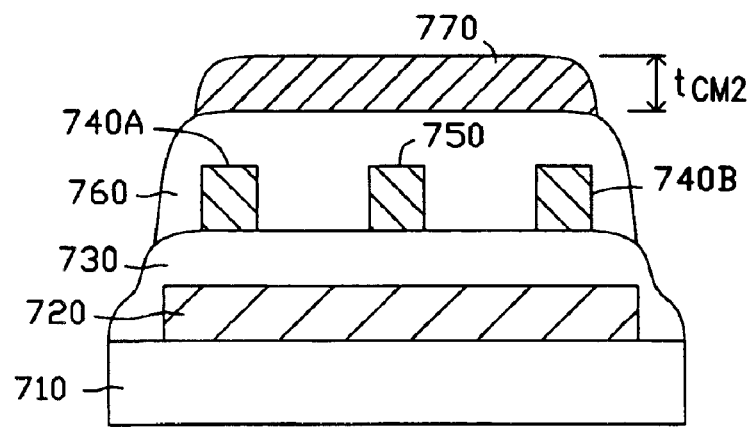

FIG. 7F illustrates the structure following the next sequence of processing. A second layer of electrically conductive material 770 is formed on the second layer of insulating material 760. The second layer of electrically conductive material 770 is formed on the second layer of insulating material 760 by depositing a conducting film of high conductivity using a technique such as evaporation, sputtering or electroplating. In one embodiment, the second layer of electrically conductive material 770 is a ground plane. In an alternative embodiment, the second layer of electrically conductive material 770 is a power plane. In a further embodiment, the second layer of electrically conductive material 770 has a thickness ($t_{CM2}$) of approximately 3 to 5 micrometers (µm). In further embodiments, the second layer of electrically conductive material 770 is coupled to a power supply or a ground potential, allowing this layer to function as a direct current (DC) bus. In one embodiment, the second layer of electrically conductive material 770 includes copper. In another embodiment, the second layer of electrically conductive material 770 includes aluminum. In still another embodiment, the second layer of electrically conductive material 770 includes any other suitably conductive material.

FIGS. 8A–8F illustrate another embodiment of a process of fabrication of transmission lines in an integrated circuit according to the teachings of the present invention. The sequence of the process can be followed as a method for forming integrated circuit lines and as a method for forming transmission lines in a memory device.

Figure 8A:
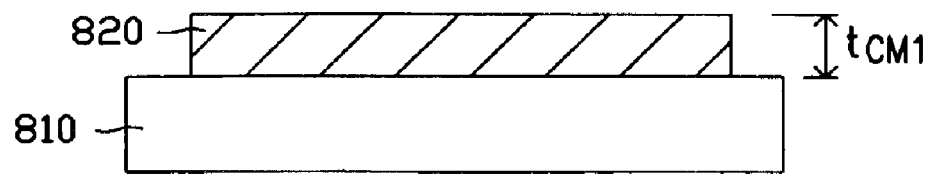
FIGS. 8A–8F illustrate another embodiment of a process of fabrication of transmission lines in an integrated circuit according to the teachings of the present invention.

FIG. 8A shows the structure after the first sequence of processing. A first layer of electrically conductive material 820 is formed on a substrate 810. The first layer of electrically conductive material 820 is formed on the substrate 810 by depositing a conducting film of high conductivity using a technique such as evaporation, sputtering or electroplating. In one embodiment, the first layer of electrically conductive material 820 is a ground plane. In an alternative embodiment, the first layer of electrically conductive material 820 is a power plane. In a further embodiment, the first layer of electrically conductive material 820 has a thickness ($t_{CM1}$) of approximately 3 to 5 micrometers (µm). In further embodiments, the first layer of electrically conductive material 820 is coupled to a power supply or a ground potential, allowing this layer to function as a direct current (DC) bus. In one embodiment, the first layer of electrically conductive material 820 includes copper. In another embodiment, the first layer of electrically conductive material 820 includes aluminum. In still another embodiment, the first layer of electrically conductive material 820 includes any other suitably conductive material. In one embodiment, the substrate 810 is a bulk semiconductor (e.g., material from the Si, SiGe and GaAs family). In an alternative embodiment, the substrate 810 is an insulator material. In another embodiment, the substrate 810 is a SOI (Silicon-On-Insulator) material.

Figure 8B:
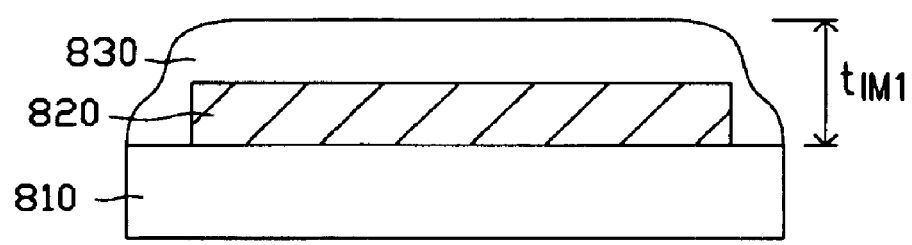

FIG. 8B illustrates the structure following the next sequence of processing. A first layer of insulating material 830 is formed on the first layer of electrically conductive material 820. In one embodiment, the first layer of insulating material 830 is formed by chemical vapor deposition (CVD). In one embodiment, the first layer of insulating material 830 is an oxide layer (e.g., $SiO_2$). In an alternative embodiment, the first layer of insulating material 830 is an insulator having a dielectric constant which is equivalent to or greater than $SiO_2$. According to the teachings of the present invention, the first layer of insulating material 830 has a thickness ($t_{IM1}$) of less than 1 µm.

Figure 8C:
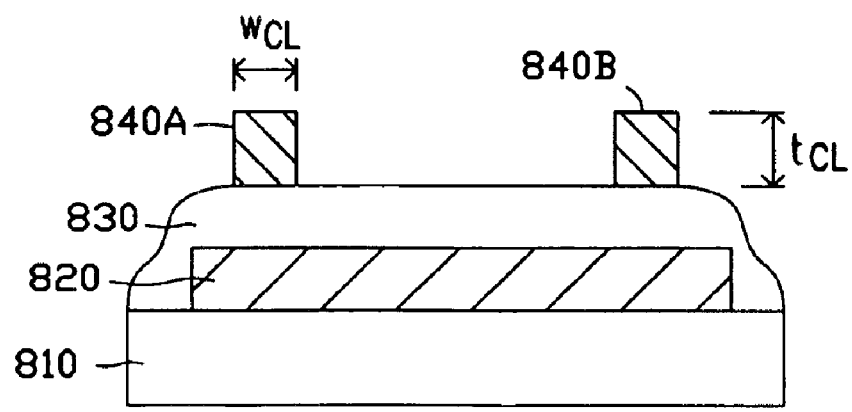

FIG. 8C illustrates the structure following the next sequence of processing. A pair of electrically conductive lines 840A and 840B are formed on the first layer of insulating material 830. In one embodiment, the pair of electrically conductive lines 840A and 840B have a width ($W_{CL}$) which is approximately equal to 1.0 micrometers (µm). However, the invention is not so limited. In one embodiment, the width ($W_{CL}$) of the electrically conductive lines, 840A and 840B is approximately 1.0 micrometers (µm). As one of ordinary skill in the art will appreciate upon reading the present disclosure, one embodiment of the present invention includes electrically conductive lines 840A and 840B formed according to the above described dimensions and separated from the substrate by an insulator having a thickness (b) of less than 1.0 micrometers (µm). In one embodiment, the pair of electrically conductive lines 840A and 840B are formed using optical lithography followed by an additive metallization, such as lift-off evaporation or electroplating, both of which are low-temperature processing.

Figure 8D:
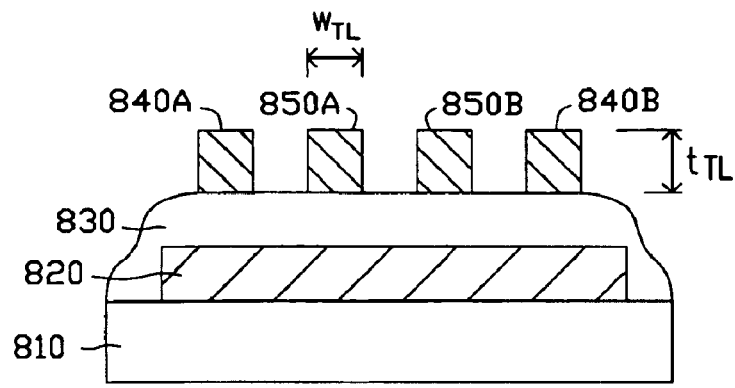

FIG. 8D illustrates the structure following the next sequence of processing. A pair of transmission lines 850A and 850B are formed on the first layer of insulating material 830. In particular, the pair of transmission lines 850A and 850B are formed between and parallel with the pair of electrically conductive lines 840A and 840B. In one embodiment, the pair of transmission lines 850A and 850B have a width ($W_{TL}$) which is approximately equal to 1.0 micrometers (µm). However, the invention is not so limited. In one embodiment, the pair of transmission lines 850A and 850B are formed with a thickness ($t_{TL}$) equal to 1.0 micrometers (µm) or less. In one embodiment, the pair of transmission lines 850A and 850B are formed according to embodiments described in application Ser. No. 09/247,680, entitled "Current Mode Signal Interconnects and CMOS Amplifier," filed on Feb. 9, 1999. Similar to the processing of FIG. 8C, the pair of transmission lines 850A and 850B can be formed using optical lithography followed by an additive metallization, such as lift-off evaporation or electroplating, both of which are low-temperature processing.

Figure 8E:
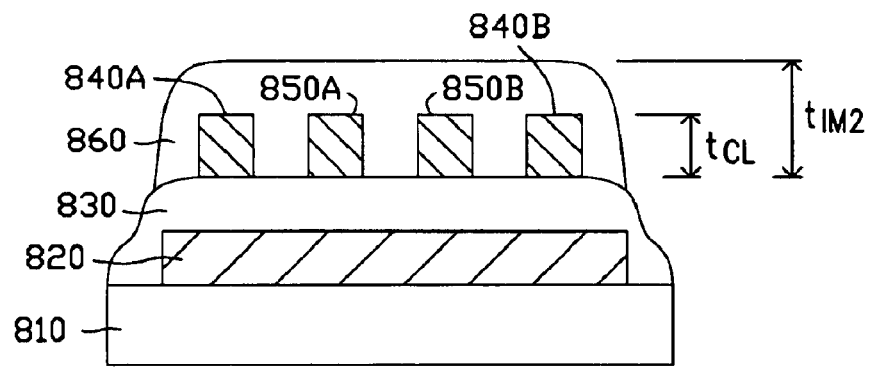

FIG. 8E illustrates the structure following the next sequence of processing. A second layer of insulating material 860 is formed on the pair of electrically conductive lines 840A and 840B and the pair of transmission lines 850A and 850B. In one embodiment, the second layer of insulating material 860 is formed by chemical vapor deposition (CVD). In one embodiment, the second layer of insulating material 860 is an oxide layer (e.g., $SiO_2$). In an alternative embodiment, the second layer of insulating material 860 is an insulator having a dielectric constant which is equivalent to or greater than $SiO_2$. In yet another embodiment, the second layer of insulating material 860 is an insulator having a dielectric constant which is less than that of $SiO_2$. In one embodiment of FIG. 8E, the second layer of insulating material 860 has a thickness ($t_{IM2}$) which is at least 50% greater than a thickness ($t_{CL}$) of the pair of electrically conductive lines 840A and 840B and the pair of transmission lines 850A and 850B. Advantageously, this level of thickness insures step coverage at the conductor corners.

Figure 8F:
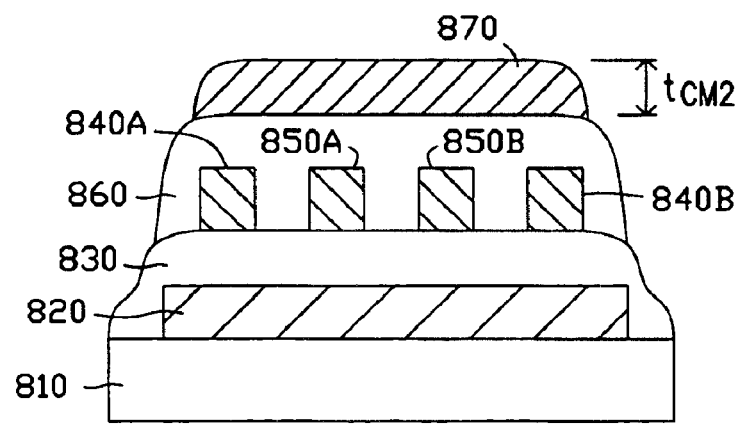

FIG. 8F illustrates the structure following the next sequence of processing. A second layer of electrically conductive material 870 is formed on the second layer of insulating material 860. The second layer of electrically conductive material 870 is formed on the second layer of insulating material 860 by depositing a conducting film of high conductivity using a technique such as evaporation, sputtering or electroplating. In one embodiment, the second layer of electrically conductive material 870 is a ground plane. In an alternative embodiment, the second layer of electrically conductive material 870 is a power plane. In a further embodiment, the second layer of electrically conductive material 870 has a thickness ($t_{CM2}$) of approximately 3 to 5 micrometers (µm). In further embodiments, the second layer of electrically conductive material 870 is coupled to a power supply or a ground potential, allowing this layer to function as a direct current (DC) bus. In one embodiment, the second layer of electrically conductive material 870 includes copper. In another embodiment, the second layer of electrically conductive material 870 includes aluminum. In still another embodiment, the second layer of electrically conductive material 870 includes any other suitably conductive material.

Figure 9:
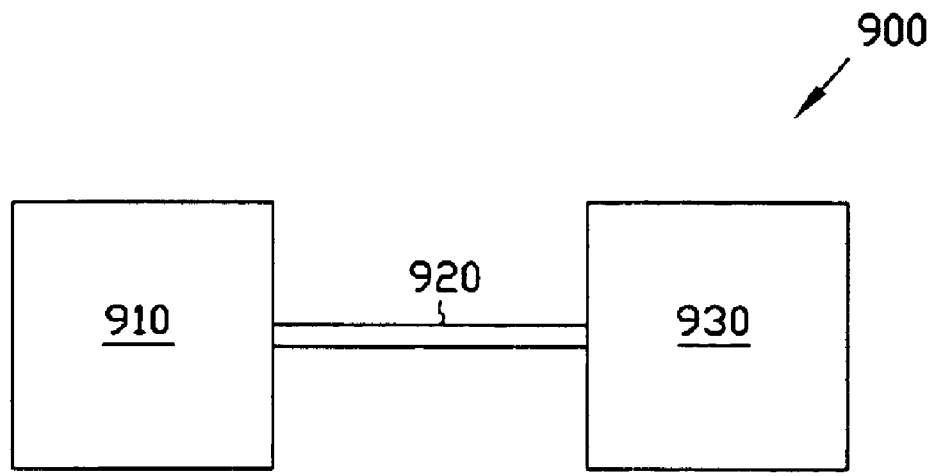
FIG. 9 is a block diagram which illustrates an embodiment of a system using line signaling according to teachings of the present invention.

FIG. 9 is a block diagram which illustrates an embodiment of a system 900 using line signaling according to teachings of the present invention. The system 900 includes a low output impedance driver 910 having a driver impedance, as is well known in the art. The low output impedance driver 910 is coupled to a transmission line circuit 920. Embodiments of the transmission line circuit 920 are described and presented above with reference to FIGS. 3–8. Moreover, the system 900 includes a termination circuit 930 having a termination impedance that is matched to the impedance of the transmission line circuit 920.

Figure 10:
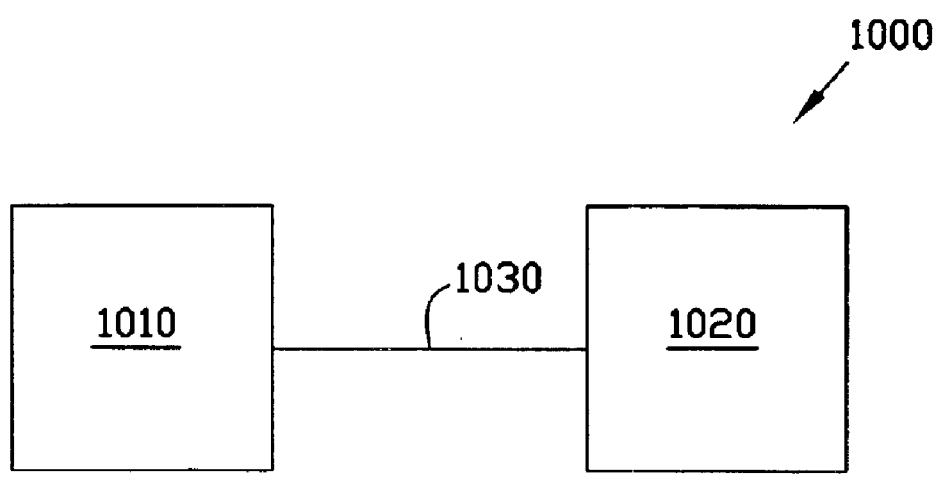
FIG. 10 is a block diagram which illustrates another embodiment of a system according to teaching of the present invention.

FIG. 10 is a block diagram which illustrates an embodiment of a system 1000 according to teaching of the present invention. The system 1000 includes an integrated circuit 1010. The integrated circuit 1010 includes the transmission line circuit described and presented above with reference to FIGS. 3–8. Additionally, the system 1000 includes a processor 1020 that is operatively coupled to the integrated circuit 1010. The processor 1020 is coupled to the integrated circuit 1010 through a system bus 1030. In one embodiment, the processor 1020 and the integrated circuit 1010 are on the same semiconductor chip.

CONCLUSION

Thus, improved methods and structures are provided using capacitive techniques to reduce noise in high speed interconnections, such as those used in CMOS integrated circuits. The present invention also offers a reduction in signal delay. Moreover, the present invention further provides a reduction in skew and crosstalk. Embodiments of the present invention also provide the fabrication of improved transmission lines for silicon-based integrated circuits using conventional CMOS fabrication techniques.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for forming transmission lines in an integrated circuit, comprising:
   forming a first layer of electrically conductive material on a substrate;
   forming a first layer of insulating material on the first layer of the electrically conductive material, wherein the first layer has a thickness of less than 1.0 micrometers ($\mu$m);
   forming a pair of electrically conductive lines on the first layer of insulating material;
   forming a transmission line on the first layer of insulating material and between and parallel with the pair of electrically conductive lines;
   forming a second layer of insulating material on the transmission line and the pair of electrically conductive lines; and
   forming a second layer of electrically conductive material on the second layer of insulating material.

2. The method of claim 1, wherein forming the first and second layer of insulating material includes forming an oxide layer.

3. The method of claim 1, wherein forming the second layer of insulating material includes forming the second layer of insulating material with a thickness which is at least approximately 50% greater than a thickness of the transmission line and the pair of electrically conductive lines.

4. The method of claim 1, wherein the method further includes coupling the second layer of electrically conductive material to a power supply.

5. The method of claim 1, wherein forming the first layer of insulating material includes forming the first layer of insulating material by chemical vapor deposition (CVD).

6. The method of claim 1, wherein forming the first layer of electrically conductive material on the substrate forming the first layer of electrically conductive material on a SOI (Silicon On Insulator) material.

7. A method for forming integrated circuit lines, comprising:
   forming a first ground plane on a substrate;
   forming a first layer of insulating material on the first ground plane, wherein the first layer has a thickness of less than 1.0 micrometers ($\mu$m);
   forming a pair of electrically conductive lines on the first layer of insulating material;
   forming a pair of integrated circuit lines on the first layer of insulating material and between and parallel with the pair of electrically conductive lines, the pair of integrated circuit lines formed as transmission lines;
   forming a second layer of insulating material on the pair of integrated circuit lines and the pair of electrically conductive lines, wherein the second layer of insulating material has a dielectric constant less than $SiO_2$; and
   forming a second ground plane on the second layer of insulating material.

8. The method of claim 7, wherein forming the first and second ground planes includes forming the first and second ground planes with a thickness of approximately 3 to 5 micrometers ($\mu$m).

9. The method of claim 7, wherein forming the first and second ground planes includes forming the first and second ground planes comprising copper.

10. The method of claim 7, wherein forming the pair of electrically conductive lines and the pair of integrated circuit lines includes forming the pair of electrically conductive lines and the pair of integrated circuit lines with a thickness and a width of approximately 1.0 $\mu$m.

11. The method of claim 7, wherein forming the pair of electrically conductive lines and the pair of integrated circuit lines include forming the pair of electrically conductive lines and the pair of integrated circuit lines with a thickness of less than 1.0 $\mu$m.

12. The method of claim 7, wherein forming the first ground plane on the substrate includes forming the first ground plane on a bulk semiconductor.

13. The method of claim 7, wherein forming the pair of electrically conductive lines and the pair of integrated circuit lines includes:
   defining the pair of electrically conductive lines and the pair of integrated circuit lines using optical lithography; and
   forming the pair of electrically conductive lines and the pair of integrated circuit lines using lift-off by evaporation.

14. A method for forming transmission lines in a memory device, comprising:
   forming a first power plane on a substrate;
   forming a first layer of insulating material on the first power plane, wherein the first layer has a thickness of less than 1.0 micrometers ($\mu$m);

forming a first transmission line on the first layer of insulating material, wherein the transmission line has a thickness and a width of approximately 1.0 µm;

forming a second layer of insulating material on the first transmission line; and forming a second power plane on the second layer of insulating material.

15. The method of claim 14, wherein the method further includes forming a first pair of electrically conductive lines on the first layer of insulating material surrounding the transmission line.

16. The method of claim 14, wherein forming the first pair of electrically conductive lines includes forming the electrically conductive lines to have a thickness and a width of approximately 1.0 µm.

17. The method of claim 14, wherein forming the first and second power planes includes forming the first and second power planes includes aluminum.

18. The method of claim 14, wherein forming the first layer of insulating material includes forming the first layer of insulating material to have a dielectric constant equivalent to or greater than the a dielectric constant of oxide.

19. The method of claim 14, wherein forming the second layer of insulating material includes forming the second layer of insulating material having a dielectric constant less than $SiO_2$.

20. The method of claim 14, wherein forming the first power plane on the substrate includes forming the first power plane on an insulator material.

21. The method of claim 14, wherein forming a first transmission line includes forming the first transmission line to have a thickness of less than 1.0 micrometers.

22. A method of forming a memory device, the method comprising:

forming a memory array;

forming a number of sense amplifiers; and forming a number of transmission lines, wherein forming the number of sense amplifiers include coupling the number of sense amplifiers to the memory array through the number of transmission lines, and wherein forming the number of transmission lines includes:

forming a first layer of electrically conductive material on a substrate;

forming a first layer of insulating material on the first layer of the electrically conductive material, wherein the first layer has a thickness of less than 1.0 micrometers (µm);

forming a transmission line on the first layer of insulating material, wherein the transmission line has a thickness and a width of approximately 1.0 micrometers;

forming a second layer of insulating material on the transmission line; and forming a second layer of electrically conductive material on the second layer of insulating material.

23. The method of claim 22, wherein forming the first and second layers of electrically conductive material includes forming the first and second layers of electrically conductive material includes copper.

24. The method of claim 22, wherein forming the transmission line includes forming the transmission line with a thickness of less than 1.0 µm.

25. The method of claim 22, wherein forming the second layer of insulating material includes forming the second layer of insulating material with a dielectric constant less than $SiO_2$.

26. The method of claim 22, further comprising coupling the second layer of electrically conductive material to a power supply.

27. The method of claim 4, wherein the method further includes coupling the first layer of electrically conductive material to ground.

28. The method of claim 14, wherein the method further includes forming each transmission line to have a characteristic impedance of about 30 ohms.

29. The method of claim 26, wherein the method further includes coupling the first layer of electrically conductive material to ground.

* * * * *

UNITED STATES PATENT AND TRADEMARK OFFICE
CERTIFICATE OF CORRECTION

| | | |
|---|---|---|
| PATENT NO. | : 7,101,770 B2 | Page 1 of 2 |
| APPLICATION NO. | : 10/060801 | |
| DATED | : September 5, 2006 | |
| INVENTOR(S) | : Leonard Forbes | |

It is certified that error appears in the above-identified patent and that said Letters Patent is hereby corrected as shown below:

On the title page, in field (73), in "Assignee", in column 1, line 1, after "ID" insert -- 83716 --.

On the title page, in field (56), under "Foreign Patent Documents", in column 2, line 1, after "3/1994" insert -- H01L 23/48 --.

On page 2, in field (56), under "U.S. Patent Documents", in column 2, below line 17, insert --

| | | | |
|---|---|---|---|
| 3,478,230 | 11/1969 | Otter, Jr. et al. | |
| 3,676,718 | 7/1972 | Anderson et al. | |
| 6,226,599 | 5/2001 | Namiki | |
| 6,350,649 | 2/2002 | Jeong et al. | |
| 6,414,476 | 7/2002 | Yagi | |
| 6,737,887 | 5/2004 | Forbes et al. | |
| 6,764,941 | 7/2004 | Yang et al. | |
| 6,787,888 | 9/2004 | Forbes et al. | |
| 6,787,906 | 9/2004 | Yang et al. | |
| 6,794,735 | 9/2004 | Forbes et al. | |
| 6,815,804 | 11/2004 | Forbes | |
| 6,833,317 | 12/2004 | Forbes et al. | |
| 6,844,256 | 1/2005 | Forbes et al. | |
| 6,846,738 | 1/2005 | Forbes et al. | |
| 6,852,613 | 2/2005 | Forbes et al. | |
| 6,884,706 | 4/2005 | Forbes et al. | |
| 6,900,116 * | 5/2005 | Forbes et al. | 438/598 |
| 6,903,003 | 6/2005 | Forbes et al. | |
| 6,903,444 | 6/2005 | Forbes et al. | |
| 6,906,402 | 6/2005 | Forbes et al. | |
| 6,914,278 | 7/2005 | Forbes et al. | |
| 2002/0145901 A1 | 10/2002 | Forbes et al. | |
| 2003/0173652 A1 | 9/2003 | Forbes et al. | |
| 2003/0173653 A1 | 9/2003 | Forbes et al. | |
| 2003/0176025 A1 | 9/2003 | Forbes et al. | |
| 2003/0176052 A1 | 9/2003 | Forbes et al. | |
| 2003/0176053 A1 | 9/2003 | Forbes et al. | |
| 2005/0006727 A1 | 1/2005 | Forbes et al. | |
| 2005/0007817 A1 | 1/2005 | Forbes et al. | |
| 2005/0017327 A1 | 1/2005 | Forbes et al. | |
| 2005/0023650 A1 | 2/2005 | Forbes et al. | |
| 2005/0030803 A1 | 2/2005 | Forbes et al. | |
| 2005/0140462 A1 | 6/2005 | Akram et al. | |

--.

UNITED STATES PATENT AND TRADEMARK OFFICE
CERTIFICATE OF CORRECTION

PATENT NO. : 7,101,770 B2
APPLICATION NO. : 10/060801
DATED : September 5, 2006
INVENTOR(S) : Leonard Forbes It is certified that error appears in the above-identified patent and that said Letters Patent is hereby corrected as shown below:

In column 15, line 53, in Claim 1, after "first layer" insert -- of insulating material --.

In column 16, line 19, in Claim 7, after "layer" insert -- of insulating material --.

In column 16, line 66, in Claim 14, after "layer" insert -- of insulating material --.

In column 17, line 2, in Claim 14, after "the" insert -- first --.

In column 17, line 11, in Claim 15, before "transmission" insert -- first --.

In column 17, line 18, in Claim 17, delete "includes" and insert -- including --, therefor.

In column 17, line 22, in Claim 18, after "than" delete "the".

In column 18, line 7, in Claim 22, after "layer" insert -- of insulating material --.

In column 18, line 19, in Claim 23, delete "includes" and insert -- including --, therefor.

Signed and Sealed this

Second Day of January, 2007

JON W. DUDAS
*Director of the United States Patent and Trademark Office*